(12) United States Patent
Trimberger

(10) Patent No.: US 8,441,038 B1
(45) Date of Patent: May 14, 2013

(54) NANO RELAY WITH FLOATING BRIDGE

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 70 days.

(21) Appl. No.: 13/010,690

(22) Filed: Jan. 20, 2011

(51) Int. Cl.
*H01L 23/52* (2006.01)
(52) U.S. Cl.
USPC .......................................................... 257/209
(58) Field of Classification Search ................... 257/209
See application file for complete search history.

(56) References Cited

U.S. PATENT DOCUMENTS

2009/0097315 A1* 4/2009 Yun et al. ................. 365/185.13
2010/0321027 A1* 12/2010 Khater et al. ................. 324/452

OTHER PUBLICATIONS

Akarvardar, K., et al., "*Analog Nanoelectromechanical Relay with Tunable Transconductance*", IEEE Electron Device Letters, vol. 30, No. 11, Nov. 2009, pp. 1143-1145.
Alon, E., et al., "*The Future of Devices & Chips: A Blast from the Past?*", Berkeley Wireless Research Center, University of California, Berkeley, pp. 1-16, created Feb. 11, 2010, http://www.eecs.berkeley.edu/BEARS/2010/alon.pdf.
Cavendish Kinetics, Base Technology, Cavendish Ushers in Next Generation of MEMS and IC Integration, downloaded Nov. 29, 2010, 1 page, http:// www.cavendish-kinetics.com.
Chen, C., et al., "*Efficient FPGAs using Nanoelectromechanical Relays*", FPGA 2010, Feb. 21-23, 2010, pp. 273-282, Monterey, CA USA.
Chen, F. et al., "*Integrated Circuit Design with NEM Relays*", IEEE/ACM, ICCAD 2008, Nov. 10-13, 2008, pp. 1-8, San Jose, CA, USA.
Choi, W.Y., et al., "*Compact Nano-Electro-Mechanical Non-Volatile Memory (NEMory) for 3D Integration*", IEEE Int'l Electron Devices Mtg. Tech. Digest, Dec. 10-12, 2007, pp. 603-606, Washington, D.C., USA, http://smdl.snu.ac.kr/Personal/panic/intconf_41.pdf.
Chong, S., "*Nanoelectromechanical (NEM) Relays Integrated with CMOS SRAM for Improved Stability and Low Leakage*", ICCAD'09, Nov. 2-5, 2009, pp. 478-484, San Jose, CA, USA.
Jammy, Raj, "*Materials Process and Integration Options for Emerging Technologies*", Sematech/ISMI Symposium, created Sep. 11, 2009, pp. 1-37, Sematech, Inc.
Kam, H., et al., "*Nano-Relay Technology for Ultra-Low-Power Digital ICs*", Berkeley Wireless Research Center Summer Retreat, Jun. 2, 2009, pp. 1-15, http://bwrc.eecs.berkeley.edu/php/pubs/pubs.php/1074/BWRC%20retreat%202009_HK_06-01-09.pdf.
Muller, R., et al., "*Use of Nano-Mechanical Relays for FPGA Power Reduction*", Department of EECS, University of California Berkeley, pp. 1-5, created Mar. 8, 2008, http://www-inst.eecs.berkeley.edu/~cthakkar/MidtermReport_241.pdf.

* cited by examiner

*Primary Examiner* — Kimberly Rizkallah
*Assistant Examiner* — Timor Karimy
(74) *Attorney, Agent, or Firm* — Scott Hewett; Gerald Chan

(57) ABSTRACT

A nano-electric switch includes a cavity base, a confinement wall, and a cavity top defining a cavity. A floating conductive bridge movable within the cavity completes an electrical circuit between a first electrical contact and a second electrical contact in a first selectable position, and breaks the electrical circuit in a second selectable position.

14 Claims, 5 Drawing Sheets

US 8,441,038 B1

NANO RELAY WITH FLOATING BRIDGE

FIELD OF THE INVENTION

An embodiment of the invention relates generally to integrated circuits (ICs) and more particularly to techniques for fabricating and operating nano-electro-mechanical relays.

BACKGROUND OF THE INVENTION

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

IC memory in general, and particularly configuration memory of an FPGA or other PLD, faces several challenges. Generally, configuration memory should provide low ON resistance and high OFF resistance (also known as sensing margin), low leakage current, resistance to single-event upsets (SEUs), and reliable switching operation over a sufficiently high switching cycle lifetime. Micro-electro-mechanical and nano-electro-mechanical (NEM) relays have been proposed for use in configuration memory of FPGAs.

FIG. 1 is a side view of a simplified conventional NEM relay 100. The terminals will be referred to as gate, source, and drain for purposes of convenient discussion, as the NEM relay 100 operates similarly to an FET for switching function. An electrical signal applied to the gate electrode 102 attracts a cantilevered beam 104 indicated by arrow 106 (e.g., by electrostatic attraction), which pulls a contact 108 toward the drain electrode 110, closing an electrical circuit between the drain electrode 110 and the source electrode 112. The cantilevered beam 104 is a conductive material or includes a conductive layer on a suitable beam material. Contact is maintained while the gate electrode 102 is active. When the signal is removed from the gate electrode 102, the cantilevered beam 104 returns to its position of rest and opens the electrical circuit between the source electrode 112 and the drain electrode 110. Alternatively, contact may be maintained by stiction and broken by application of repulsive electrostatic or electromagnetic force.

While such relays provide the desired electrical performance, they do not scale well. As dimensions of NEM relays are reduced, the cantilevered beam(s) become relatively stiffer, and higher voltages are needed to actuate the relays. These higher voltages are not compatible with low-voltage ICs.

Therefore, techniques for providing NEM relays that avoid the problems of the prior art and that reliably scale to smaller dimensions are desirable.

SUMMARY OF THE INVENTION

In one embodiment, a nano-electric switch has a cavity base, a confinement wall and a cavity top defining a cavity in the integrated circuit. A floating conductive bridge movable within the cavity completes an electrical circuit between a first electrical contact and a second electrical contact in a first selectable position of the floating conductive bridge and breaks the electrical circuit in a second selectable position of the floating conductive bridge. In a particular embodiment, the cavity base is an insulating layer in an integrated circuit, such as in a BEOL layer of an FPGA. In an alternative embodiment, the nano-electric switch is formed in a silicon interposer.

In a further embodiment, the nano-electric switch includes a first actuator on the cavity base within the cavity. In a particular embodiment, the first actuator extends above the cavity base a first distance within the cavity and the first electrical contact extends from the cavity base a second distance greater than the first distance. In a particular embodiment, the first actuator is an electrostatic actuator. In another embodiment, the first actuator is an electromagnetic actuator. In a further embodiment, the integrated circuit includes a second actuator on the cavity top within the cavity. In a particular embodiment, the second actuator is a second electrostatic actuator. In an alternative embodiment, the contacts are on a side of the confinement wall and the floating conductive bridge moves laterally, rather than vertically.

In a particular embodiment, the floating conductive bridge includes a magnetic material.

In a particular embodiment, the confinement wall includes at least one gap having a width more narrow than the floating bridge. In a further embodiment, the confinement wall includes additional gaps to form a discontinuous confinement wall or holes. In a particular embodiment, the cavity top includes holes formed in the cavity top.

In a particular embodiment, the floating conductive bridge includes a conductive layer and an insulating layer. In a further embodiment, the floating conductive bridge includes an oxide-nitride-oxide structure formed over a metal layer.

In a particular embodiment, an integrated circuit has a semiconductor substrate and a back end-of-line stack formed on the semiconductor substrate. A nano-electric switch formed in the back end-of-line stack has a floating conductive bridge movable within a cavity in the back end-of-line stack so as to complete an electrical circuit between a first electrical contact and a second electrical contact in a first selectable position of the floating conductive bridge and to break the electrical circuit in a second selectable position of the floating conductive bridge.

In another embodiment, a floating bridge relay is fabricated by defining a cavity base layer of the floating bridge relay, forming a first electrical contact extending from the cavity base layer and a second electrical contact extending from the cavity base layer, forming a conductive bridge and a beam supporting the conductive bridge, forming a cavity wall around the conductive bridge having a gap, the beam extending through the gap, forming a cavity top over the conductive bridge, and then separating the conductive bridge from the beam to form a floating bridge retained within a cavity defined by the cavity base layer, the cavity wall, and the cavity top. In a particular embodiment, the cavity base layer is defined in an integrated circuit. In alternative embodiments, the cavity base layer is defined in a printed wiring board, a package substrate, or an interposer, such as a silicon interposer.

In one embodiment, separating the conductive bridge from the beam uses an etch technique to remove (e.g., etch away) the beam. Alternatively, an ion milling technique is used to cut the beam from the floating conductive bridge. In a further embodiment, a bottom actuator is formed on or in the cavity base. In a particular embodiment, the cavity top is formed with a conductive layer, which in a further embodiment is a patterned conductive layer. In a particular embodiment, the conductive layer is patterned to form an electro-magnet.

In a further embodiment, the floating bridge includes a conductive layer proximate to the first electrical contact and the second electrical contact and an insulating layer disposed on the conductive layer of the floating bridge between the conductive layer and the cavity top. In a yet further embodiment, oxide-nitride-oxide layers are formed on the metal layer.

DETAILED DESCRIPTION OF THE DRAWINGS

Figure 1:
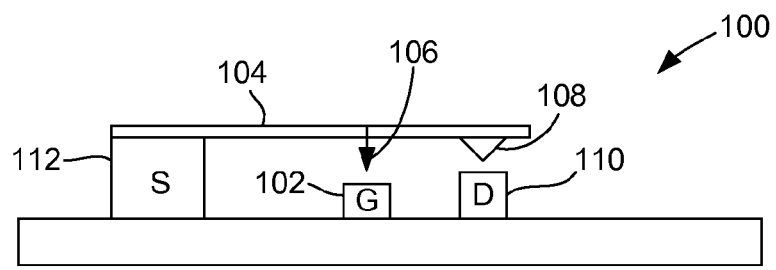
FIG. 1 is a side view of a simplified conventional NEM relay.
Figure 2A:
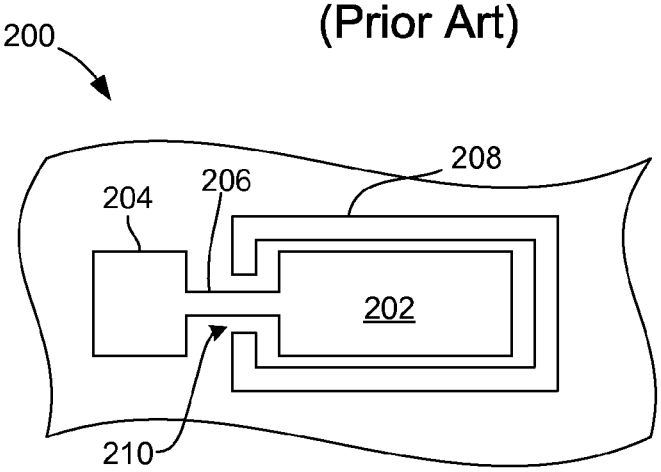
FIG. 2A is a plan view of partially fabricated floating bridge relay according to an embodiment.

FIG. 2A is a plan view of partially fabricated floating bridge relay 200 according to an embodiment. A bridge 202 is connected to a post 204 with a narrow beam 206, i.e., the beam 206 is more narrow than the bridge 202, allowing a confinement wall 208 to substantially surround the bridge 202 except for a gap 210 that the beam 206 extends through. In subsequent processing steps, the bridge is separated from the post, and optionally from the beam (e.g., the post and beam will be etched away), leaving the bridge within the confinement wall, as the bridge is wider than the gap in the confinement wall. In some embodiments, the beam is made from a different material than the bridge so that the beam can be more easily removed in a later step while leaving the bridge intact. In some embodiments, a plurality of beams, which may extend through a single gap or multiple gaps, support the conductive floating bridge during manufacture.

Figure 2B:
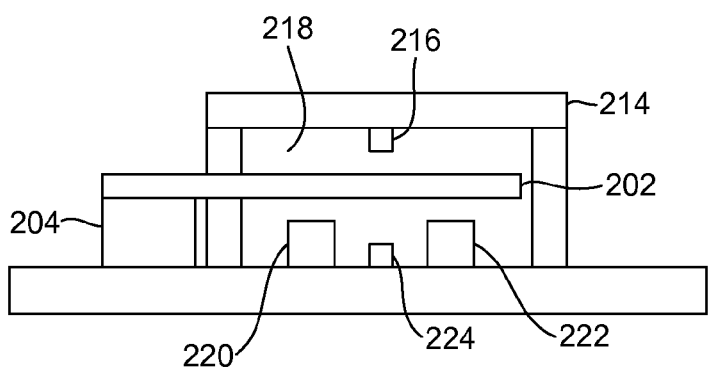
FIG. 2B is a cross section view of the floating bridge relay of FIG. 2A with a cavity top and top contact.

FIG. 2B is a cross section view of the floating bridge relay of FIG. 2A with a cavity top 214 and a top actuator 216. The cavity top 214 is formed over the confinement wall 208 and will retain the bridge 202 within the cavity 218 when the bridge is separated from the post 204. A first electrical contact 220 and a second electrical contact 222 have been formed beneath the bridge 202, which is conductive on at least the side facing the electrical contacts 220, 222. A bottom actuator 224 will attract the bridge to the contacts, closing an electrical circuit, and the top actuator 216 will attract the bridge away from the contacts, opening the electrical circuit. The top actuator is omitted in an alternative embodiment, and the cavity top layer will attract the bridge away from the electrical contacts, such as by electrostatic or magnetic attraction. Terms such as "top" and "base" are used solely for purposes of convenient discussion. For example, a floating bridge relay according to an embodiment may be inverted for use in an application.

Figure 3A:
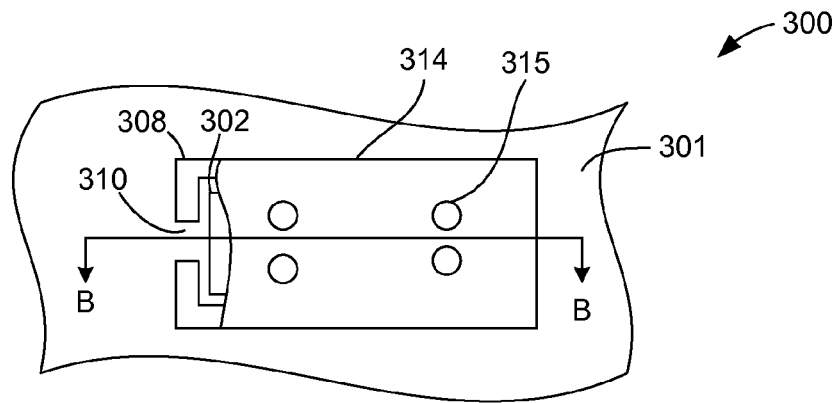
FIG. 3A is a plan view of a floating bridge relay according to an embodiment with the cavity top partially removed for purposes of illustration.

FIG. 3A is a plan view of a floating bridge relay 300 according to an embodiment with the cavity top 314 partially removed for purposes of illustration. A floating bridge 302 is confined within the cavity defined by the cavity base 301, which in a particular embodiment is an oxide layer in a back-end-of-line (BEOL) stack of an IC, the confinement wall 308, and the cavity top 314. The floating bridge is not permanently physically connected to any support structure, though in use, it may be in contact with some contacts or landing sites inside its cavity. The gap 310 through which a beam (not shown) previously extended is more narrow than the floating bridge 302. In a further embodiment, additional gaps (not shown) are included in the confinement wall to facilitate the cavity etch process.

The post and at least a portion of the beam (compare, FIGS. 2A, 2B) have been etched away or otherwise removed, such as with an ion mill or acid etch. In a particular embodiment, the cavity top provides an etch block so that the bridge material underneath the cavity top is not etched away. In a particular embodiment, an anisotropic etch process, such as a capacitively coupled plasma etch process, is used to separate the bridge from the beam or post. The etch selectively removes the material(s) of the beam and post while not removing the conductive bridge. In an alternative embodiment, holes 315 are formed in the cavity top 314 to facilitate the cavity etch process.

Figure 3B:
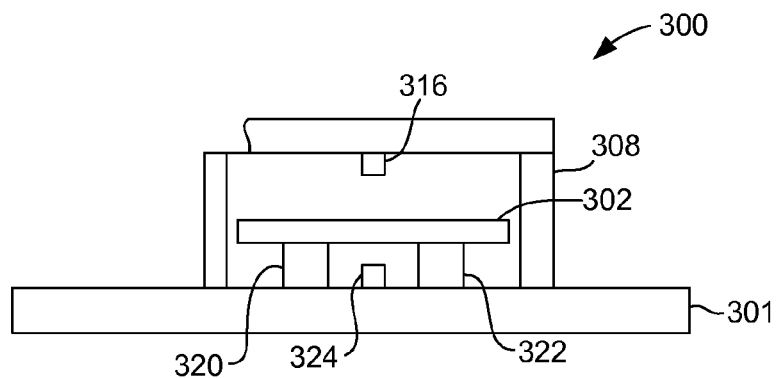
FIG. 3B is a cross section view of the floating bridge relay of FIG. 3A taken along section line B-B with the floating bridge relay in a closed position.

FIG. 3B is a cross section view of the floating bridge relay of FIG. 3A taken along section line B-B with the floating bridge relay in a closed position. The floating bridge 302 is held against the contacts 320, 322 to form a closed electrical circuit. In a particular embodiment, a bottom actuator 324 creates an electro-magnetic field that pulls the floating bridge 302 toward the bottom actuator 324. For example, the bottom actuator creates an electro-static field that attracts the floating bridge or a magnetic field that attracts the floating bridge, which in a particular embodiment includes a ferro-magnetic material such as nickel or cobalt or a ferri-magnetic material. In a particular embodiment, the floating bridge is charged using a top actuator or a bottom electrical contact, or charged from an active cavity top.

In a particular embodiment, the cavity bottom layer 301 and the confinement wall 308 are oxide, such as silicon dioxide. The electrical contacts 320, 322 are a conductive material, such as aluminum or copper and the floating bridge 302 is made from a layer of conductive material, such as aluminum, cobalt, nickel, iron or copper, or includes a conductive layer of metal or other material. In a particular embodiment, the floating bridge includes a copper layer with a barrier layer formed during a BEOL process of an IC or silicon interposer. In an alternative embodiment, an aluminum layer proximate to the contacts, and one or more dielectric layers over the aluminum layer.

In a particular embodiment, an oxide layer is disposed on the aluminum layer of the floating bridge. In a further embodiment, oxide-nitride-oxide (ONO) layers are disposed on the aluminum layer of the floating bridge. It is believed that an ONO layer may improve stiction of the floating bridge to the top of the cavity or improve static charge retention. In a particular embodiment, the post and beam are fabricated from amorphous silicon, which is removed using a fluorine-based plasma etch technique. The cavity top is an oxide, nitride, or other layer, and in a particular embodiment acts as an etch-blocking layer for the floating bridge when the beam is removed. In an alternative embodiment, the etch technique used to remove the post and beam does not significantly etch the material of the floating bridge.

In one embodiment, electrical contacts 320, 322 are formed on a metal layer N of a BEOL stack of an IC or silicon interposer, the floating bridge is formed on metal layer N+1, the cavity top is formed on metal layer N+2, the confinement wall 308 is metal, such as a patterned via layer(s) between N, N+1 and N+2 and metal layer N+1. Confinement wall 308 may be discontinuous, with multiple gaps smaller than the bridge size. Similarly, the cavity top may be fabricated with holes smaller than the bridge size to facilitate subsequent etching of the support material around the floating bridge inside the cavity.

In some embodiments, a configuration signal is applied to the bottom actuator 324 during configuration, and then the configuration signal is removed. Stiction, which is a semantic contraction of "sticky friction" familiar to those of skill in the art of micro- and nano-electrical-mechanical systems, holds the floating bridge 302 in the closed position (i.e., the relay is non-volatile in that it retains its state even when power is removed from the IC). In another embodiment, configuration signals are applied to both the top actuator 316 and the bottom actuator 324, a first configuration signal being applied to the top actuator 316 repelling the floating bridge 302, and a second configuration signal being applied to the bottom actuator to attract the floating bridge 302.

In an alternative embodiment, the bottom actuator is omitted and a configuration signal is applied to the contacts 320, 322. For example, the floating bridge has a negative electrostatic charge and a positive voltage is applied to both contacts, which pulls the floating bridge to the contacts and closes the circuit. A large charge may be applied to the floating bridge to cause it to switch, a smaller charge would be insufficient to move the bridge, but would serve to transmit current to complete a circuit between the contact terminals. Stiction maintains the closed circuit until the relay is reconfigured. The electrostatic or magnetic force required to switch the floating bridge is greater than the stiction force that holds the bridge in one position. Applying identical charge to the bridge 203 and the bottom actuator 324 while simultaneously applying an opposite charge to the top actuator 316 will generate an upward force on the floating bridge. Opposite charges on the floating bridge and the bottom actuator will provide a downward force. In operation, the charges on the floating bridge are small and stiction of the floating bridge to the contacts prevents the floating bridge from being moved.

Figure 3C:
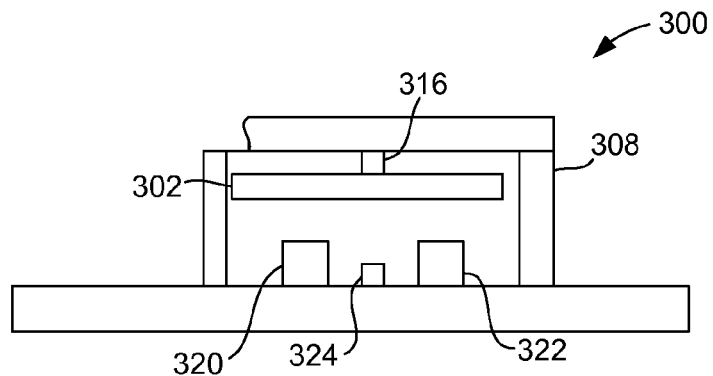
FIG. 3C is a cross section view of the floating bridge relay of FIG. 3A in an open position.

FIG. 3C is a cross section view of the floating bridge relay of FIG. 3A in an open position. A top actuator 316 attracts the floating bridge 302 away from the contacts 320, 322, breaking (opening) the electrical circuit between the first contact 320 and the second contact. In a particular embodiment, a configuration signal applied to the top actuator 316 insures that the floating bridge 302 is not touching the contacts 320, 322. In an alternative embodiment, the top actuator is omitted and a signal applied to the bottom actuator 324 is used to push the floating bridge 302 away from the contacts 320, 322, overcoming stiction. In yet another embodiment, configuration signals are applied to both the top actuator 316 and the bottom actuator, a first configuration signal being applied to the top actuator 316 attracting the floating bridge 302, and a second configuration signal being applied to the bottom actuator to repel the floating bridge 302.

Figure 4A:
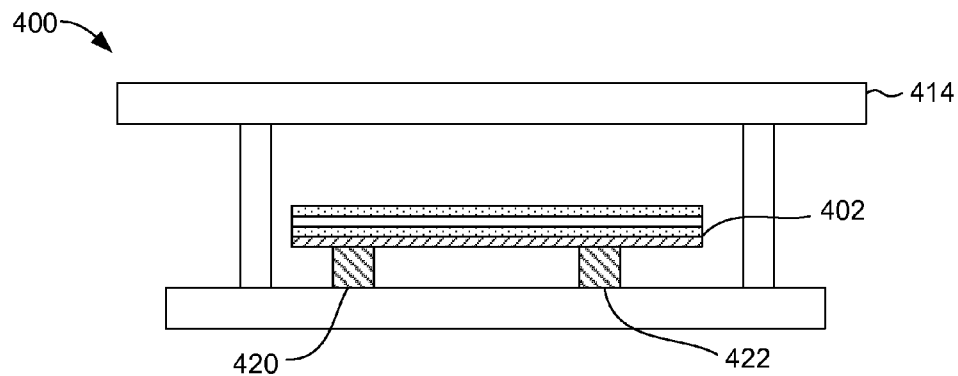
FIG. 4A is a cross section view of a floating bridge relay with an active cavity top layer according to another embodiment.

FIG. 4A is a cross section view of a floating bridge relay 400 with an active cavity top 414 according to another embodiment. Contacts 420, 422 receive a configuration (programming) signal that attracts or repels the floating bridge 402. After attracting the floating bridge 402 to the contacts 420, 422, stiction holds the floating bridge 402 against the contacts 420, 422 to maintain a closed circuit condition. A second signal applied to the contacts repels the floating bridge, overcoming the stiction and moving the floating bridge to the top of the cavity where it is held by electrostatic forces or electromagnetic forces, for example. In a particular embodiment, the floating bridge includes a magnetic material, such as a thin film layer of cobalt or nickel, and the cavity top 414 is magnetized. In a more particular embodiment, the cavity top 414 includes a layer of ferro-magnetic material, such as cobalt or nickel. In an alternative embodiment, the cavity top 414 includes an electromagnet, such as a conductive coil or wires, that magnetically attract or repel a magnetic floating bridge according to the direction of current flow, i.e., an actuating cavity top.

In a particular embodiment, the floating bridge has an electrically conductive layer (e.g., an aluminum layer) proximate to the contacts 420, 422, a first oxide layer (e.g., a silicon dioxide layer) over the conductive layer, a nitride layer (e.g., a silicon nitride layer) over the first oxide layer, and a second oxide layer over the nitride layer (i.e., an ONO structure over a conductive layer).

Figure 4B:
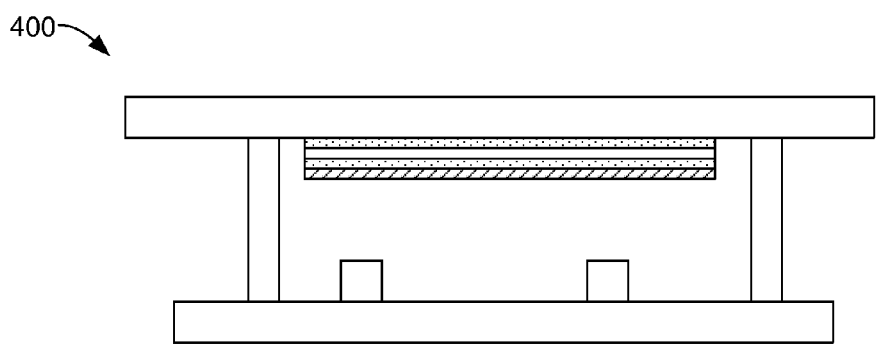
FIG. 4B is a cross section view of the floating bridge relay of FIG. 4A in an open circuit configuration.

FIG. 4B is a cross section view of the floating bridge relay 400 of FIG. 4A in an open circuit condition.

Figure 4C:
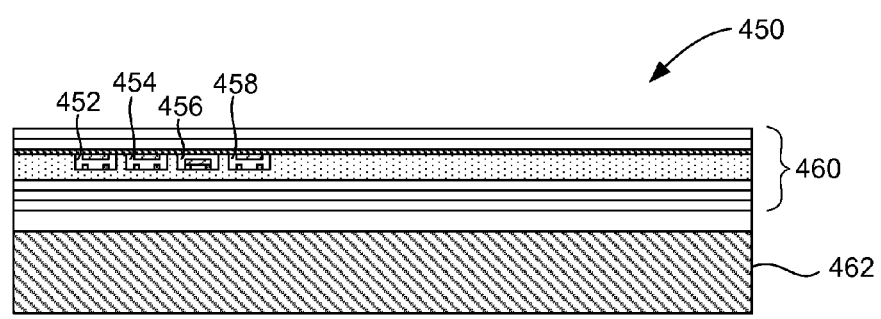
FIG. 4C is a cross section view of an IC with floating bridge relays in accordance with FIGS. 4A and 4B in a BEOL stack according to an embodiment.

FIG. 4C is a cross section view of an IC 450 with floating bridge relays 452, 454, 456, 458 in accordance with FIGS. 4A and 4B in the BEOL stack 460 according to an embodiment. Floating bridge relay 456 is in a closed circuit condition, the other floating bridge relays are in an open circuit condition. The BEOL stack is basically a series of patterned metal layers interconnected by conductive visa through intervening dielectric layers. The patterned metal layers are, for example, copper damascene or dual damascene layers or patterned aluminum thin film layers. Those of skill in the art of IC processing are familiar with the terms front-end-of-line (FEOL) and back-end-of-line (BEOL), which refer generally to the semiconductor device processing and interconnection layers, respectively. FEOL processes often include relatively high-temperature processing, such as for silicide formation or thermal oxide growth. BEOL processes often have lower temperature limits, which restricts the types of materials and processes used.

In ICs, semiconductor area is typically in high demand. While embodiments fabricate floating bridge relays on the semiconductor wafer 462, fabricating floating bridge relays 452, 454, 456, 458 in the BEOL stack preserves semiconductor wafer area for other purposes, such as semiconductor devices. The floating bridge relays are optionally arranged as an array, similar to an array of conventional memory cells, with word lines and bitlines. In some embodiments, each floating bridge relay has a READ word line, a WRITE wordline, and a bitline.

Figure 5:
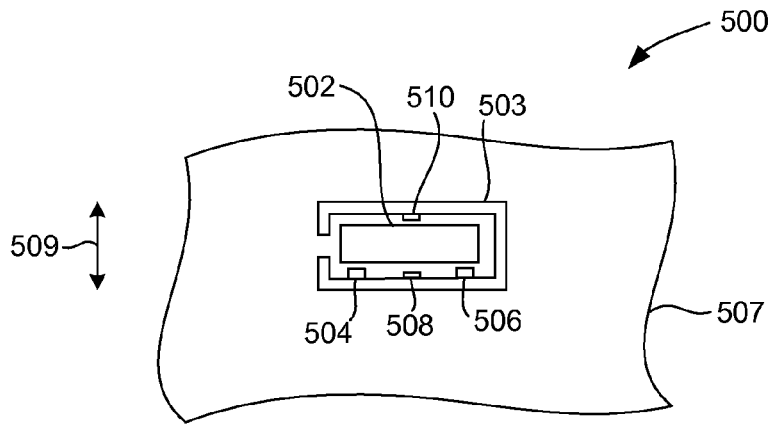
FIG. 5 is a plan view of a floating bridge relay according to an embodiment with the cavity top omitted to show details of the floating bridge and contacts.

FIG. 5 is a plan view of a floating bridge relay 500 according to an embodiment with the cavity top omitted to show details of the floating bridge 502 and contacts 504, 506 (compare, FIG. 2A). The floating bridge 502 moves laterally within the confinement wall 503, i.e., in the plane of the substrate (wafer) 507 as indicated by the double arrow 509 to close or break an electrical circuit between the contacts 504, 506 which extend from a side of the confinement wall 503, rather than moving in a vertical direction. In a particular embodiment, a conductive layer of the floating bridge 502 is defined in the same metal layer as the contacts 504, 506. In a further embodiment, an actuator 508 is also defined in the same metal layer. The actuator 508 is alternatively on the side of the cavity opposite the contacts, or a second actuator 510, which in a particular embodiment is defined in the same metal layer, is optionally included. Alternatively, one or both of the contacts is used as an actuator.

Figure 6:
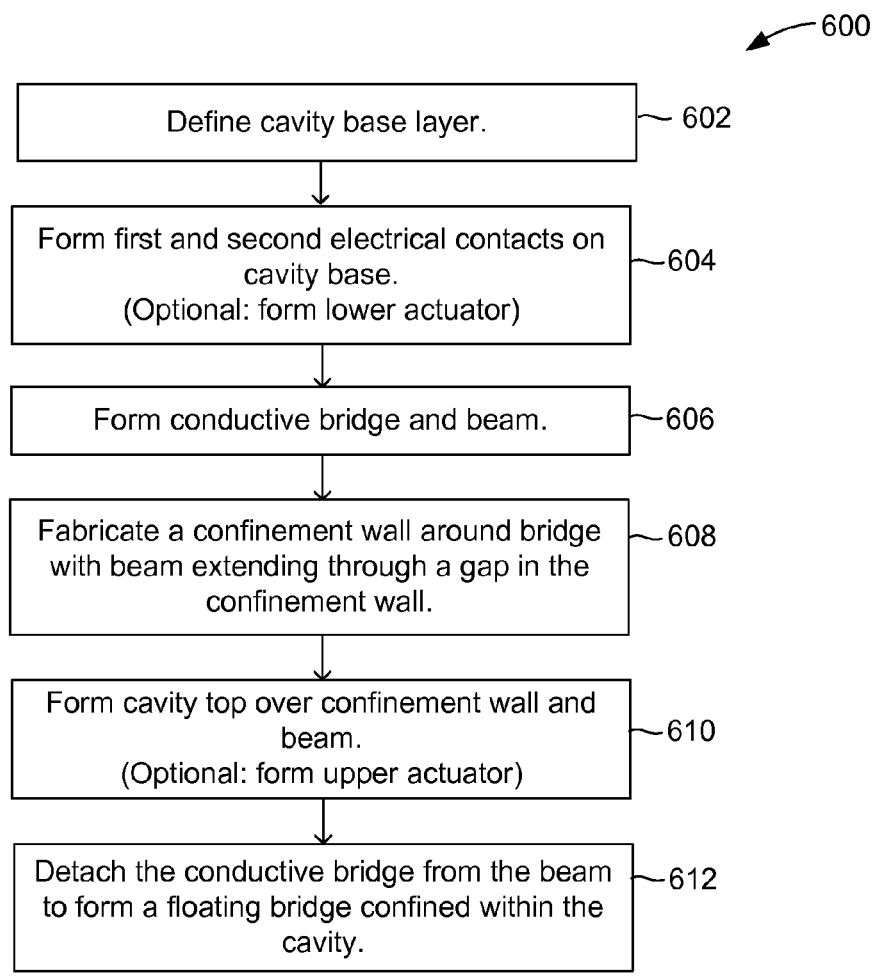
FIG. 6 is a flow chart of a method of fabricating a floating bridge relay according to an embodiment.

FIG. 6 is a flow chart of a method of fabricating 600 a floating bridge relay according to an embodiment. A cavity base layer is defined (step 602). In a particular embodiment, the cavity base is a layer in an IC (e.g., a back-end-of-process (BEOL) oxide layer). In an alternative embodiment, the cavity base is a layer in a printed wiring board (PWB), packaging substrate, or interposer, such as a silicon interposer, which can have layers similar to the BEOL layers of an IC. A first electrical contact and a second electrical contact are formed on a cavity base (step 604). In a further embodiment, a bottom actuator is formed on or in the cavity base. A conductive bridge supported by a beam is formed over the first and second electrical contacts (step 606). A confinement wall is formed around the conductive bridge (step 608). The confinement wall includes a gap through which the beam extends and supports the conductive bridge within the confinement wall.

In an alternative embodiment, the confinement wall is formed before the conductive bridge and beam are formed.

A cavity top is formed over the confinement wall and over the conductive bridge to form a cavity (step 610). In an exemplary embodiment, the cavity is filled with a sacrificial material, such as an oxide, the top layer is deposited over the filled cavity, and the sacrificial material is removed, such as through holes in the cavity top and sidewalls. In a further embodiment, the cavity top includes a top actuator. The beam is etched away to form a floating bridge within the cavity (step 612). In a particular embodiment, the beam and an associated post are formed from deposited silicon and the floating conductive bridge includes a deposited layer of aluminum. The confinement wall is sufficiently high so that the floating bridge can move between the contacts and the cavity top to make and break the electrical circuit, yet sufficiently low to allow cycling of the relay.

In a particular embodiment, the floating bridge relay is a configuration switch in an FPGA and reliably cycles for at least 500 cycles. Although the floating bridge relay is slower in switching states compared to other configuration memory, such as SRAM, it is easily incorporated into a CMOS or other integrated circuit to provide non-volatile memory with excellent SEU immunity. Alternative non-volatile memory, such as flash memory or phase change memory, often uses processing techniques or materials that are challenging to incorporate into a CMOS IC.

Conventional NEM relays with cantilever beams are difficult to scale to smaller geometries because the relative stiffness of the cantilever beam increases with decreasing geometry. Floating bridge relays according to an embodiment does not use a cantilever beam, and are easily scaled. A switching operation of a floating bridge relay according to an embodiment does not have to overcome the stiffness of a cantilevered beam, allowing lower switching voltages and lower switching power to be used to change states.

Figure 7:
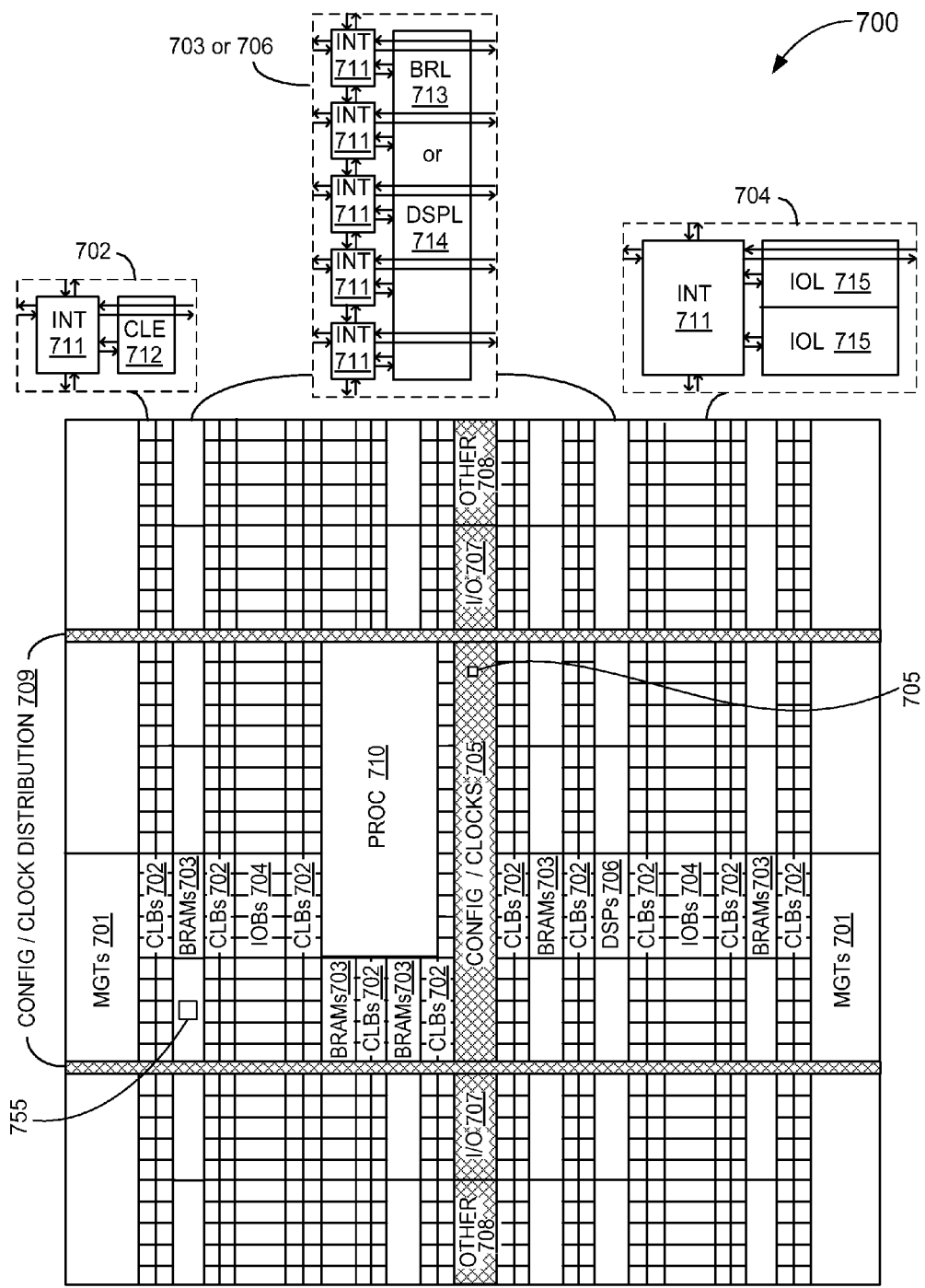
FIG. 7 is a plan view of an FPGA with floating bridge relays according to an embodiment.

FIG. 7 is a plan view of an FPGA with floating bridge relays according to an embodiment. The FPGA architecture 700 includes a large number of different programmable tiles including multi-gigabit transceivers (MGTs) 701, configurable logic blocks (CLBs) 702, random access memory blocks (BRAMs) 703, input/output blocks (IOBs) 704, configuration and clocking logic (CONFIG/CLOCKS) 705, digital signal processing blocks (DSPs) 706, specialized input/output blocks (I/O) 707 (e.g., configuration ports and clock ports), and other programmable logic 708 such as digital clock managers, analog-to-digital converters, system monitoring logic, and so forth. Some FPGAs also include dedicated processor blocks (PROC) 710.

In some FPGAs, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA. The programmable interconnect element (INT) 711 also includes the connections to and from the programmable logic element within the same tile, as shown by the examples included at the top of FIG. 7.

For example, a CLB 702 can include a configurable logic element (CLE) 712 that can be programmed to implement user logic plus a single programmable interconnect element (INT) 711. A BRAM 703 can include a BRAM logic element (BRL) 713 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL) 714 in addition to an appropriate number of programmable interconnect elements. An IOB 704 can include, for example, two instances of an input/output logic element (IOL) 715 in addition to one instance of the programmable interconnect element (INT) 711. As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

An embodiment of the invention can be incorporated in any of several portions of the FPGA 700. For example, arrays of floating bridge NEM relays 705, 755 according to one or more embodiments are incorporated in BRAMs or configuration memory. In particular embodiments, floating bridge NEM relays are arranged in rows and columns, as is familiar to those of skill in the art of IC memory arrays.

The configuration memory cells in an FPGA are used to control the operation of other circuits. Configuration memory is distributed throughout an FPGA and is generally present in numerous types of programmable blocks, such as CLBs and IOs. Within the FPGA, the configuration memory cells are placed in columns, where there could be groups of columns of memory cells separated by circuits controlled by the memory cells. Memory cell outputs can connect to the circuits using poly or metal layers. Embodiments of the invention are particularly effective in FPGAs because blocks of memory are interspersed with other types of circuitry, such as logic blocks. Embodiments fabricating floating bridge NEM relays in the BEOL layers are desirable as such techniques conserve semiconductor wafer area for other purposes.

Floating bridge NEM relays are particularly desirable for configuration memory because of their SEU immunity. An error in configuration memory can change the functionality of a block in the FPGA. In a particular embodiment, the FPGA 700 is fabricated using a technology design less than 90 nm. It is particularly challenging to provide SEU tolerant memory for small technology designs with semiconductor-based memory cells because as the design technology decreases, the separation between nodes of a memory cell decreases and the amount of charge needed to upset a data value stored at a node also typically decreases.

Floating bridge NEM relays can replace switches in interconnect in FPGA 700. Interconnect element INT 711 performs the function of programmably connecting wires to one another to form the circuits using the functions in the CLBs 702, IOBs 704, DSPs 706, BRAMs 703 and other circuits in the FPGA. In prior art FPGAs, those connections are made with a multiplexer that has configuration memory cells on its control inputs. The low on-resistance of a floating bridge NEM relay makes it a suitable substitute for the switching transistor in the multiplexer.

While the present invention has been described in connection with specific embodiments, variations of these embodiments will be obvious to those of ordinary skill in the art. Therefore, the spirit and scope of the appended claims should not be limited to the foregoing description.

What is claimed is:

1. A nano-electric switch comprising:
   a cavity base;
   a confinement wall;
   a cavity top;
   a cavity defined by the cavity base, the confinement wall and the cavity top;
   a first electrical contact;
   a second electrical contact; and
   a floating conductive bridge movable within the cavity so as to complete an electrical circuit between the first electrical contact and the second electrical contact in a first selectable position of the floating conductive bridge and to break the electrical circuit in a second selectable position of the floating conductive bridge of the nano-electric switch;
   wherein the floating conductive bridge is translatable within the cavity.

2. The nano-electric switch of claim 1 wherein the cavity base is an insulating layer in an integrated circuit.

3. The nano-electric switch of claim 2 wherein the insulating layer is an oxide layer in a back-end-of-line stack of a field-programmable gate array.

4. The nano-electric switch of claim 1 further comprising a first actuator on the cavity base within the cavity.

5. The nano-electric switch of claim 4 wherein the first actuator extends above the cavity base a first distance within the cavity and the first electrical contact extends from the cavity base a second distance greater than the first distance.

6. The nano-electric switch of claim 4 wherein the first actuator is an electrostatic actuator.

7. The nano-electric switch of claim 4 further comprising a second actuator on the cavity top within the cavity.

8. The nano-electric switch of claim 1 wherein the first contact extends from a side of the confinement wall and the second contact extends from the side of the confinement wall.

9. The nano-electric switch of claim 1 wherein the floating conductive bridge includes a magnetic material.

10. The integrated circuit of claim 1 wherein the confinement wall includes at least one gap having a width more narrow than the floating bridge.

11. The integrated circuit of claim 1 wherein the cavity top includes holes formed in the cavity top, wherein the holes are above the conductive bridge.

12. The integrated circuit of claim 1 wherein the floating conductive bridge includes a conductive layer and an insulating layer.

13. The integrated circuit of claim 1 wherein the floating conductive bridge includes a metal layer, a first oxide layer formed on the metal layer, a nitride layer formed on the first oxide layer, and a second oxide layer formed on the nitride layer.

14. An integrated circuit comprising:
a semiconductor substrate;
a back end-of-line stack formed on the semiconductor substrate; and
a nano-electric switch formed in the back end-of-line stack having a floating conductive bridge movable within a cavity in the back end-of-line stack so as to complete an electrical circuit between a first electrical contact and a second electrical contact in a first selectable position of the floating conductive bridge and to break the electrical circuit in a second selectable position of the floating conductive bridge;
wherein the floating conductive bridge is translatable within the cavity.

* * * * *